US011809664B2

(12) United States Patent
Kobayashi et al.

(10) Patent No.: US 11,809,664 B2
(45) Date of Patent: Nov. 7, 2023

(54) INPUT APPARATUS

(71) Applicant: Alps Alpine Co., Ltd., Tokyo (JP)

(72) Inventors: Tetsuro Kobayashi, Fukushima-ken (JP); Yasunori Watanabe, Miyagi-ken (JP); Shinya Abe, Fukushima-ken (JP)

(73) Assignee: Alps Alpine Co., Ltd.

( * ) Notice: Subject to any disclaimer, the term of this patent is extended or adjusted under 35 U.S.C. 154(b) by 0 days.

(21) Appl. No.: 17/858,459

(22) Filed: Jul. 6, 2022

(65) Prior Publication Data

US 2022/0342507 A1    Oct. 27, 2022

Related U.S. Application Data

(63) Continuation of application No. PCT/JP2020/046727, filed on Dec. 15, 2020.

(30) Foreign Application Priority Data

Jan. 27, 2020  (JP) .................... 2020-011086

(51) Int. Cl.
G06F 3/044    (2006.01)

(52) U.S. Cl.
CPC .......... *G06F 3/0443* (2019.05); *G06F 3/0448* (2019.05)

(58) Field of Classification Search
None
See application file for complete search history.

(56) References Cited

U.S. PATENT DOCUMENTS

| 9,244,104 B2* | 1/2016 | Hahl .................... G01N 27/221 |
| 10,352,977 B2* | 7/2019 | Bharathan .......... G01R 27/2605 |
| 2009/0101417 A1 | 4/2009 | Suzuki et al. |
| 2013/0240339 A1 | 9/2013 | Miyazaki et al. |
| 2015/0177298 A1* | 6/2015 | Sugiura .............. G01R 27/2605 324/658 |
| 2015/0324027 A1* | 11/2015 | Heo ....................... G06F 3/0412 345/173 |
| 2016/0191056 A1 | 6/2016 | Kataoka et al. |

(Continued)

FOREIGN PATENT DOCUMENTS

| CN | 101110002 A | * | 1/2008 | .......... G06F 3/0354 |
| CN | 112334868 A | * | 2/2021 | ......... G06F 3/04186 |
| JP | H06-162888 A | | 6/1994 | |

(Continued)

OTHER PUBLICATIONS

International Search Report (English translation) for corresponding International Application No. PCT/JP2020/046727 dated Feb. 16, 2021 (5 Pages).

*Primary Examiner* — Duane N Taylor, Jr.

(74) *Attorney, Agent, or Firm* — Harness, Dickey & Pierce, P.L.C.

(57) ABSTRACT

An input apparatus includes at least one operating area on an operating surface, at least one first sensing electrode corresponding to the operating area, a plurality of electrodes around the first sensing electrode, and a control unit configured to, when contact of an operating body with the operating area is detected by the first sensing electrode, make control different according to a contact operation on the one operating area according to a sum of capacitance values of electrodes of the plurality of peripheral electrodes around the operating area where the contact of the operating body is detected.

9 Claims, 12 Drawing Sheets

(56) References Cited

U.S. PATENT DOCUMENTS

2017/0214400 A1   7/2017  Koresawa et al.
2021/0278293 A1*  9/2021  Kinokuni .............. G06F 3/0447

FOREIGN PATENT DOCUMENTS

| JP | 2009-111996 A | 5/2009 |
| JP | 2010-266133 A | 11/2010 |
| JP | 2012-048341 A | 3/2012 |
| JP | 2016-122525 A | 7/2016 |
| JP | 2017-135099 A | 8/2017 |
| JP | 2018-139436 A | 9/2018 |

* cited by examiner

FIG. 5

| ELECTRODE | WEIGHTING |
|---|---|
| FIRST SENSING ELECTRODE 122 | 0.7 |
| SECOND SENSING ELECTRODE 131 | 1.0 |
| SECOND SENSING ELECTRODE 132 | 1.9 |

FIG. 11
COMPARATIVE EXAMPLE

| 68 | 62 | 56 | 53 | 48 | 44 | 44 | 43 | 43 | 43 | 45 |
|----|----|----|----|----|----|----|----|----|----|----|
| 68 | 62 | 54 | 48 | 46 | 43 | 41 | 41 | 44 | 45 | 47 |
| 65 | 56 | 47 | 43 | 37 | 35 | 36 | 40 | 41 | 48 | 51 |
| 57 | 48 | 39 | 34 | 33 | 30 | 28 | 34 | 37 | 46 | 55 |
| 49 | 41 | 34 | 30 | 28 | 27 | 28 | 34 | 38 | 45 | 57 |
| 46 | 36 | 32 | 29 | 26 | 22 | 27 | 31 | 40 | 47 | 62 |
| 43 | 32 | 29 | 27 | 23 | 20 | 26 | 31 | 39 | 46 | 63 |
| 41 | 32 | 26 | 23 | 21 | 22 | 24 | 31 | 38 | 45 | 59 |
| 43 | 32 | 26 | 25 | 24 | 21 | 23 | 29 | 36 | 41 | 52 |
| 45 | 36 | 29 | 25 | 25 | 22 | 24 | 27 | 34 | 40 | 48 |
| 45 | 39 | 31 | 28 | 26 | 25 | 25 | 28 | 32 | 38 | 41 |
| 42 | 36 | 31 | 29 | 23 | 24 | 24 | 25 | 28 | 30 | 33 |
| 38 | 31 | 29 | 26 | 24 | 22 | 21 | 23 | 23 | 22 | 25 |

FIG. 12
COMPARATIVE EXAMPLE

| 49 | 44 | 45 | 40 | 40 | 38 | 38 | 36 | 37 | 37 | 38 |
|----|----|----|----|----|----|----|----|----|----|----|
| 47 | 43 | 41 | 39 | 35 | 33 | 37 | 36 | 39 | 41 | 40 |
| 50 | 44 | 41 | 38 | 36 | 38 | 37 | 37 | 42 | 43 | 44 |
| 47 | 42 | 35 | 35 | 34 | 34 | 34 | 39 | 41 | 46 | 46 |
| 45 | 39 | 38 | 35 | 31 | 32 | 38 | 45 | 46 | 43 | 48 |
| 37 | 36 | 32 | 35 | 34 | 36 | 38 | 44 | 46 | 46 | 50 |
| 34 | 34 | 30 | 34 | 32 | 34 | 38 | 40 | 42 | 44 | 51 |
| 37 | 34 | 29 | 31 | 34 | 35 | 38 | 41 | 45 | 42 | 52 |
| 35 | 32 | 31 | 32 | 29 | 29 | 31 | 36 | 41 | 38 | 47 |
| 34 | 31 | 29 | 27 | 23 | 27 | 27 | 31 | 34 | 39 | 40 |
| 38 | 33 | 29 | 28 | 25 | 24 | 28 | 29 | 33 | 34 | 36 |
| 31 | 29 | 26 | 25 | 24 | 25 | 24 | 25 | 27 | 28 | 30 |
| 26 | 28 | 25 | 24 | 22 | 22 | 23 | 24 | 24 | 27 | 24 |

INPUT APPARATUS

CLAIM OF PRIORITY

This application is a Continuation of International Application No. PCT/JP2020/046727 filed on Dec. 15, 2020, which claims benefit of Japanese Patent Application No. 2020-011086 filed on Jan. 27, 2020. The entire contents of each application noted above are hereby incorporated by reference.

BACKGROUND OF THE INVENTION

1. Field of the Invention

The present invention relates to input apparatuses.

2. Description of the Related Art

Japanese Unexamined Patent Application Publication No. 2018-139436 (PTL 1) discloses a technique for regarding an electrically conductive object that has touched a capacitive button including a plurality of multiplex electrodes (an inner second sensing element and an outer first sensing element) as having different sizes between a case where only the electrostatic capacitance of the second sensing element indicates approach of the electrically conductive object and a case where both of the capacitance of the second sensing element and the capacitance of the first sensing element indicate approach of the electrically conductive object.

United States Regulation FMVSS 118 requires that the roofs and blinds of vehicles are not closed when a switching operation is performed with a sphere having a diameter of 40 mm corresponding to a child's hand to prevent an erroneous operation with a child's hand.

However, if a plurality of capacitive buttons is disposed close to each other, the technique disclosed in PTL 1 cannot apply multiplexed electrode configuration to each of the plurality of capacitive buttons, which makes it impossible to detect the size of the electrically conductive object. For this reason, the technique disclosed in PTL 1 cannot make control when a contact operation is performed using an operating body having a size larger than the size of a supposed operating body different from control when a contact operation is performed using the supposed operating body.

SUMMARY OF THE INVENTION

The present invention provides an input apparatus including at least one operating area on an operating surface, at least one first sensing electrode corresponding to the operating area, a plurality of electrodes around the first sensing electrode, and a control unit configured to, when contact of an operating body with the operating area is detected by the first sensing electrode, make control different according to a contact operation on the one operating area according to a sum of capacitance values of electrodes of the plurality of peripheral electrodes around the operating area where the contact of the operating body is detected.

According to an embodiment, control when a contact operation is performed with an operating body having a size larger than the size of a supposed operating body can be made different from control when a contact operation is performed with the supposed operating body.

BRIEF DESCRIPTION OF THE DRAWINGS

FIG. 5 is a diagram showing examples of weightings stored in a storage according to an embodiment;

FIGS. 9A to 9C are diagrams illustrating the result of measurement of the capacitance values performed by the input apparatus according to an example (Example 1);

FIG. 9D is a diagram illustrating the result of calculation of the sum performed by the input apparatus according to an example (Example 1);

FIGS. 10A to 10C are diagrams illustrating the result of measurement of the capacitance values performed by the input apparatus according to an example (Example 2);

FIG. 10D is a diagram illustrating the result of calculation of the sum performed by the input apparatus according to an example (Example 2);

FIG. 11 is a diagram illustrating the result of calculation of the sum of the capacitance values according to Comparative Example 1; and FIG. 12 is a diagram illustrating the result of calculation of the sum of the capacitance values according to Comparative Example 2.

DESCRIPTION OF THE PREFERRED EMBODIMENTS

An embodiment will be described hereinbelow with reference to the drawings.

Configuration of Input Apparatus 100

Figure 1:
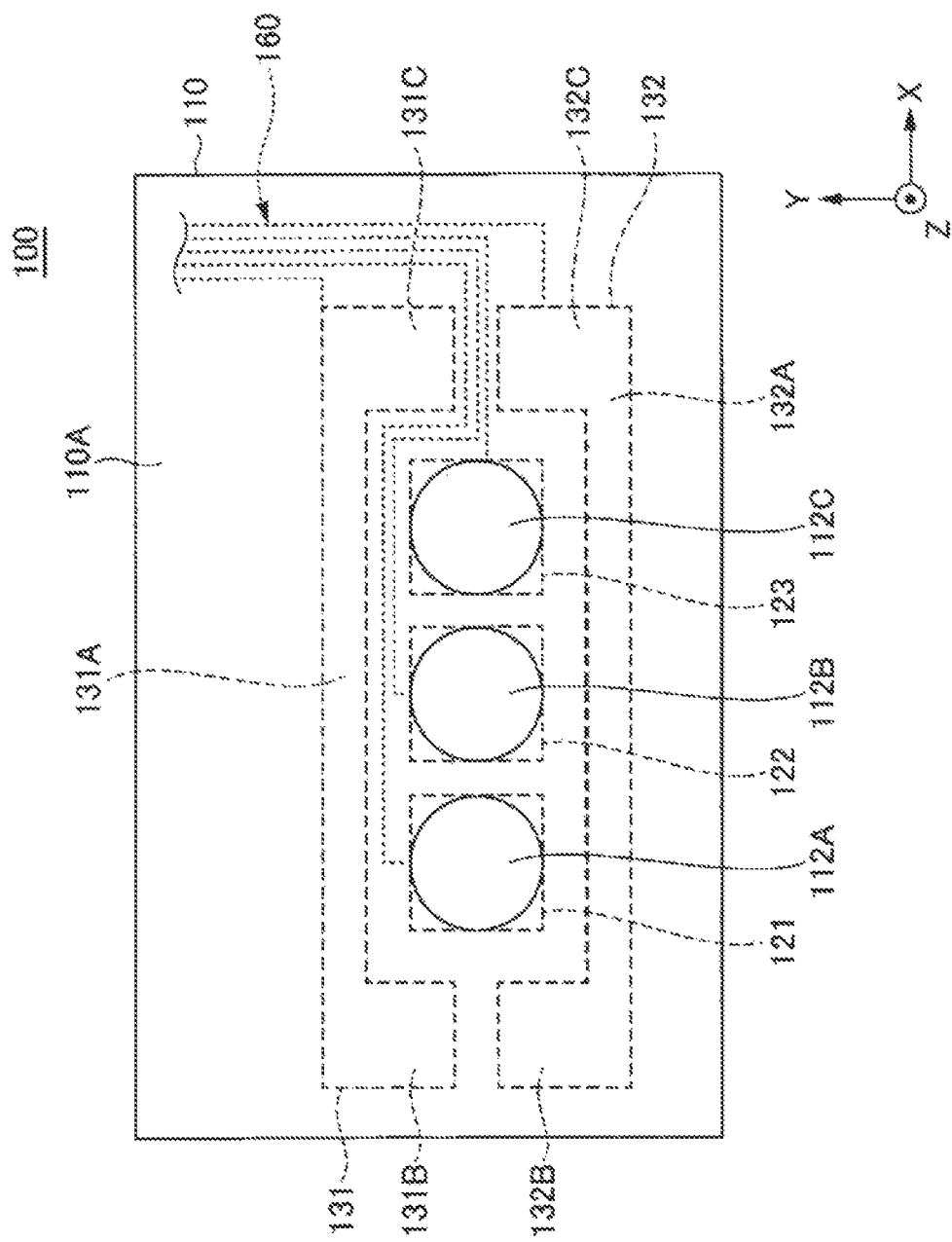
FIG. 1 is a plan view of an input apparatus according to an embodiment.

FIG. 1 is a plan view of an input apparatus 100 according to an embodiment illustrating the configuration thereof. As shown in FIG. 1, the input apparatus 100 includes an operation panel 110, a first sensing electrode 121, a first sensing electrode 122, a first sensing electrode 123, a second sensing electrode 131, and a second sensing electrode 132.

The operation panel 110 is a plate-like resin member. The operation panel 110 is attached to a predetermined position, for example, by being fitted in the predetermined position. In the example shown in FIG. 1, the operation panel 110 has a horizontally long rectangular shape. However, this is illustrative only. The operation panel 110 may have various shapes according to its installation site. The operation panel 110 has a rectangular, substantially planar operating surface 110A. The operating surface 110A includes three operating areas 112A, 112B, and 112C arranged in line in the lateral direction (the X-axis direction). The operating areas 112A, 112B, and 112C are areas in which a contact operation is to be performed by the operator. The operating areas 112A, 112B, and 112C are assigned different functions. In the example shown in FIG. 1, all the operating areas 112A, 112B, and 112C have a circular shape. However, this is illustrative only. The operating areas 112A, 112B, and 112C may have another shape (for example, a square shape). In this embodiment, the lengthwise direction of the operating surface 110A (the X-axis direction in the drawing) is the lateral direction, the crosswise direction of the operating surface 110A (the Y-axis direction in the drawing) is the front-to-back direction, and the perpendicular direction of the operating surface 110A (the Z-axis direction in the drawing) is the vertical direction.

The first sensing electrode 121 is disposed at a position overlapping with the operating area 112A on the back of the operating surface 110A. The first sensing electrode 121 has a square shape that covers the whole of the operating area 112A in plan view. The first sensing electrode 121 is capable of detecting contact of an operating body with the operating area 112A from a change in the capacitance value of the first sensing electrode 121.

The first sensing electrode 122 is disposed at a position overlapping with the operating area 112B on the back of the operating surface 110A. The first sensing electrode 122 has a square shape that covers the whole of the operating area 112B in plan view. The first sensing electrode 122 is capable of detecting contact of an operating body with the operating area 112B from a change in the capacitance value of the first sensing electrode 122.

The first sensing electrode 123 is disposed at a position overlapping with the operating area 112C on the back of the operating surface 110A. The first sensing electrode 123 has a square shape that covers the whole of the operating area 112C in plan view. The first sensing electrode 123 is capable of detecting contact of an operating body with the operating area 112C from a change in the capacitance value of the first sensing electrode 123.

The second sensing electrode 131 and the second sensing electrode 132 are disposed around the first sensing electrodes 121 to 123. In this embodiment, the second sensing electrode 131 and the second sensing electrode 132 are used only as "peripheral electrodes" (described later) and are not used as an area where a contact operation is performed. However, this is only one embodiment. The second sensing electrode 131 and the second sensing electrode 132 may be used as areas where a contact operation is performed. The second sensing electrode 131 and the second sensing electrode 132 constitute a rectangular frame surrounding the periphery of the first sensing electrodes 121 to 123. The second sensing electrode 131 and the second sensing electrode 132 are separated from each other at the center in the front-to-back direction (Y-axis direction).

The second sensing electrode 131 constitutes the front portion (the Y-axis positive portion) of the rectangular frame. Specifically, the second sensing electrode 131 has a straight portion 131A extending in the lateral direction (the X-axis direction) in front of the first sensing electrodes 121 to 123 and ends 131B and 131C extending linearly from the opposite ends of the straight portion 131A backward (in the Y-axis negative direction) to portions where the second sensing electrode 131 is spaced apart from the second sensing electrode 132.

The second sensing electrode 132 constitutes the back portion (the Y-axis positive portion) of the rectangular frame. Specifically, the second sensing electrode 132 has a straight portion 132A extending in the lateral direction (the X-axis direction) at the back of the first sensing electrodes 121 to 123 and ends 132B and 132C extending linearly from the opposite ends of the straight portion 132A forward (in the Y-axis positive direction) to portions where the second sensing electrode 132 is spaced apart from the second sensing electrode 131.

When an operating body comes into contact with one of the operating areas 112A to 112C, the capacitance values of the second sensing electrode 131 and the second sensing electrode 132 change according to the contact position and the contact area (the size of the operating body).

The first sensing electrodes 121 to 123 and the second sensing electrodes 131 and 132 are made of a metal film (for example, a copper film), indium tin oxide (ITO), or another electrically conductive material.

One example of the input apparatus 100 is an overhead console mounted on the ceiling surface in the compartment of an automobile and used to operate the roof and the blind at the ceiling of the automobile. For example, the operating area 112A is touched with an operator's finger when only the roof is to be closed. For example, the operating area 112B is touched with an operator's finger when only the blind is to be closed. For example, the operating area 112C is touched with an operator's finger when both of the roof and the blind are to be closed.

System Configuration of Input Apparatus 100

Figure 2:
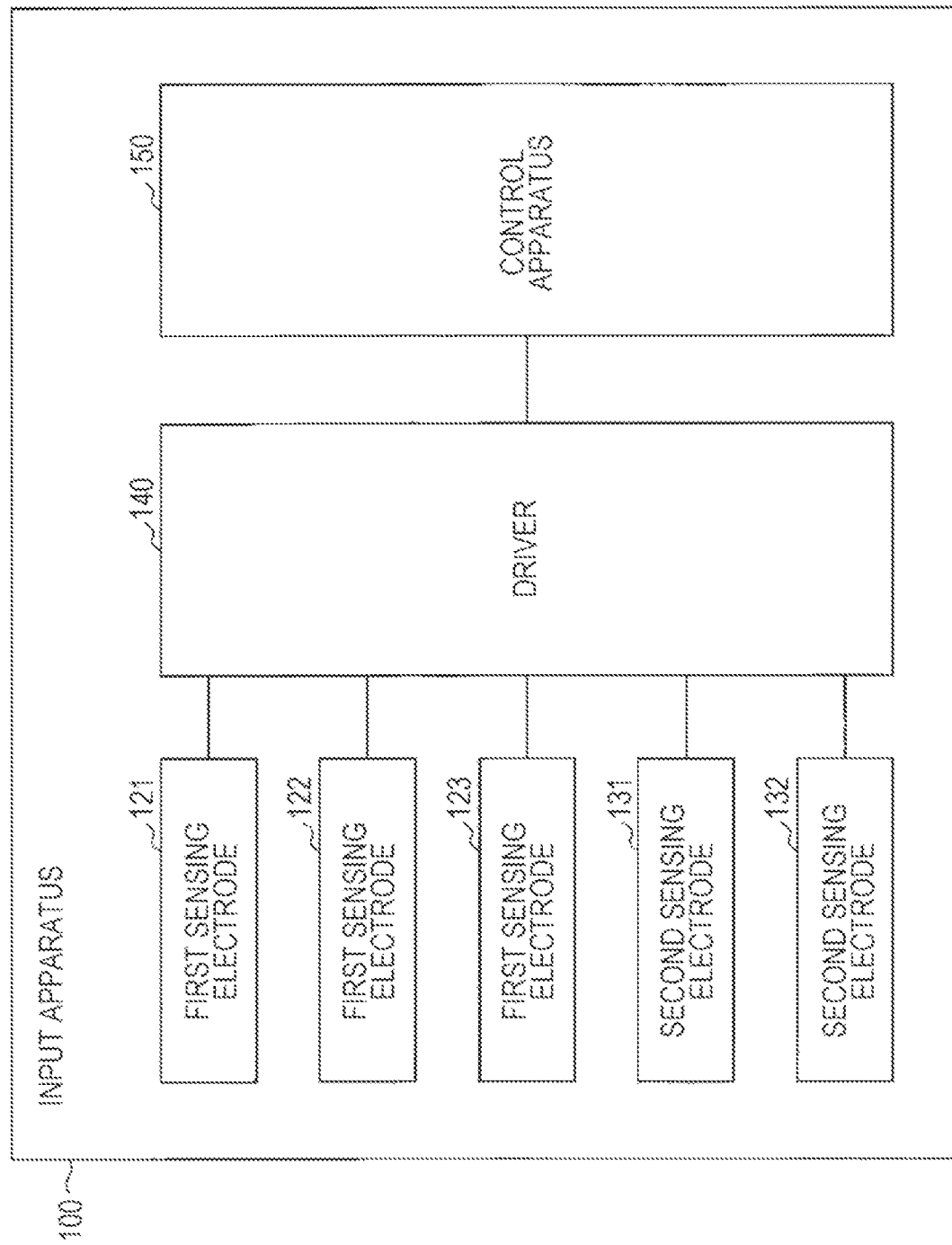
FIG. 2 is a block diagram illustrating the system configuration of the input apparatus according to an embodiment.

FIG. 2 is a block diagram illustrating the system configuration of the input apparatus 100 according to an embodiment. As shown in FIG. 2, the input apparatus 100 includes the first sensing electrode 121, the first sensing electrode 122, the first sensing electrode 123, the second sensing electrode 131, the second sensing electrode 132, a driver 140, and a control apparatus 150.

The driver 140 is connected to each of the first sensing electrodes 121 to 123 and the second sensing electrodes 131 and 132 with a wiring pattern 160 (see FIG. 1). The driver 140 drives the first sensing electrodes 121 to 123 and the second sensing electrodes 131 and 132 to detect the respective capacitance values of the first sensing electrodes 121 to 123 and the second sensing electrodes 131 and 132. The driver 140 outputs capacitance detection signals indicating the capacitance values of the first sensing electrodes 121 to 123 and the second sensing electrodes 131 and 132 to the control apparatus 150.

The control apparatus 150 controls the entire input apparatus 100. For example, the control apparatus 150 determines whether a contact operation has been performed on each of the operating areas 112A, 112B, and 112C on the basis of the capacitance value of each of the first sensing electrodes 121 to 123 and the second sensing electrodes 131 and 132 specified by the capacitance detection signals obtained from the driver 140. For example, when the control apparatus 150 determines that a contact operation on one of the operating areas 112A, 112B, and 112C has been performed and determines to validate the contact operation, the control apparatus 150 outputs a control signal corresponding to the operating area to the device to be operated. An example of the control apparatus 150 is a microcomputer.

Hardware Configuration of Control Apparatus 150

Figure 3:
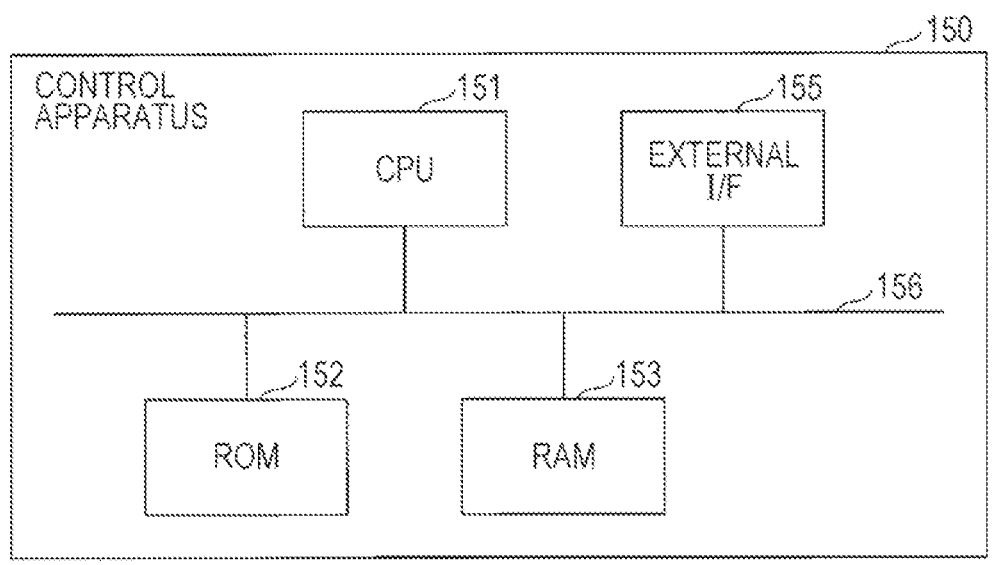
FIG. 3 is a block diagram illustrating the hardware configuration of a control apparatus according to an embodiment.

FIG. 3 is a block diagram illustrating the hardware configuration of the control apparatus 150 according to an embodiment. As shown in FIG. 3, the control apparatus 150 includes a central processing unit (CPU) 151, a read only memory (ROM) 152, a random access memory (RAM) 153, and an external interface (I/F) 155. The hardware is connected to one another via a bus 156.

The CPU 151 controls the operation of the control apparatus 150 by executing various programs stored in the ROM 152. The ROM 152 is a nonvolatile memory. For example, the ROM 152 stores programs to be executed by the CPU 151, data necessary for the CPU 151 to execute the programs, and so on. The RAM 153 is a main storage, such as a dynamic random access memory (DRAM) or a static random access memory (SRAM). For example, the RAM 153 functions as a word area to be used by the CPU 151 in executing the programs. The external I/F 155 controls input and output of data to/from an external device (for example, the driver 140 or the device to be controlled by the input apparatus 100).

Functional Configuration of Control Apparatus 150

Figure 4:
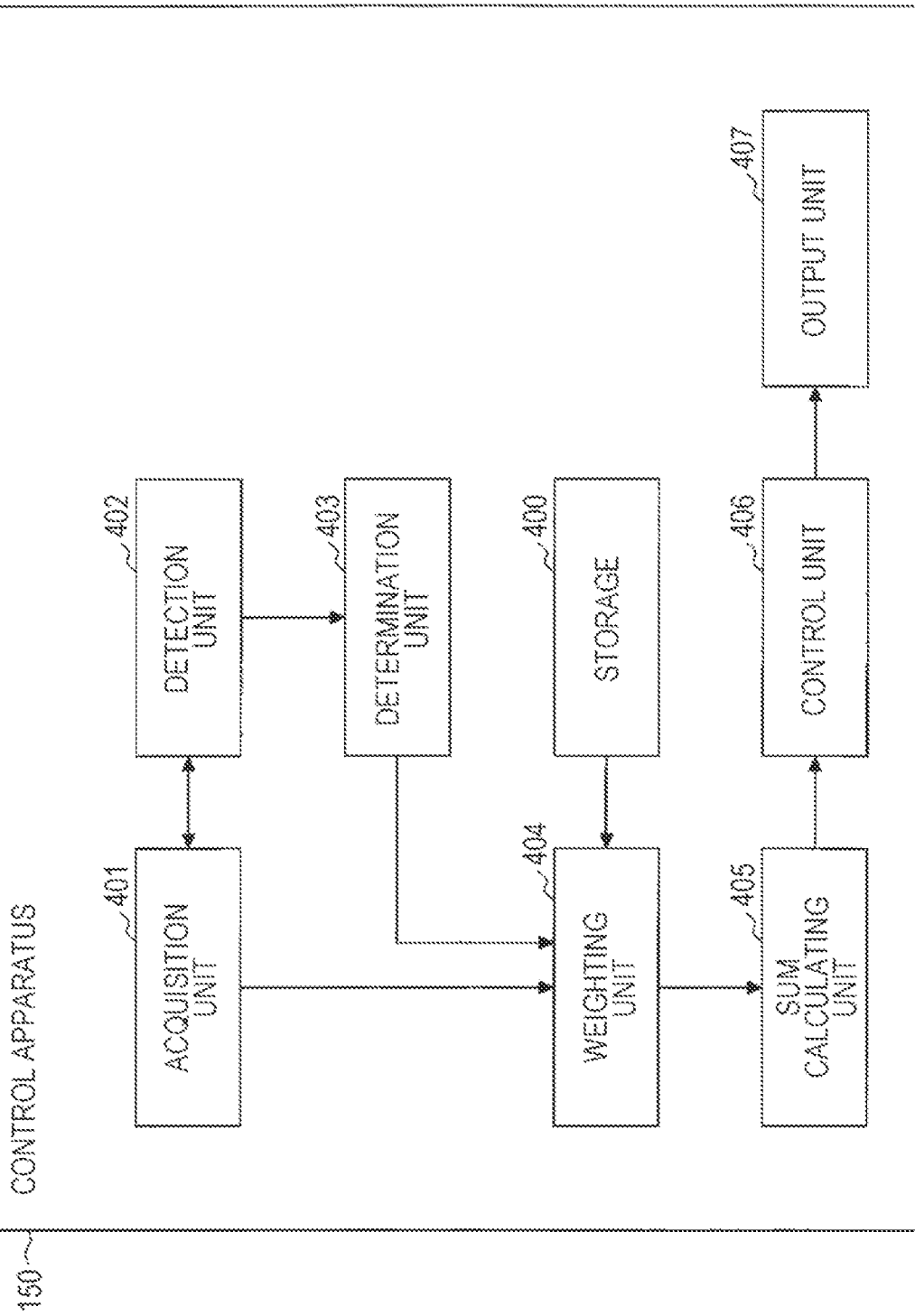
FIG. 4 is a block diagram illustrating the functional configuration of the control apparatus according to an embodiment.

FIG. 4 is a block diagram illustrating the functional configuration of the control apparatus 150 according to an embodiment. As shown in FIG. 4, the control apparatus 150 includes a storage 400, an acquisition unit 401, a detection unit 402, a determination unit 403, a weighting unit 404, a sum calculating unit 405, a control unit 406, and an output unit 407.

The storage 400 stores weightings for the first sensing electrodes 121 to 123 and the second sensing electrodes 131 and 132.

The acquisition unit 401 acquires the capacitance values of the first sensing electrodes 121 to 123 and the second sensing electrodes 131 and 132. Specifically, the acquisition unit 401 acquires the capacitance values of the first sensing electrodes 121 to 123 and the second sensing electrodes 131 and 132 by acquiring the capacitance detection signals output from the driver 140.

The detection unit 402 detects contact of an operating body with one of the operating areas 112A to 112C on the basis of the capacitance values of the first sensing electrodes 121 to 123 acquired by the acquisition unit 401. For example, when the capacitance value of the first sensing electrode 121 is higher than a predetermined threshold, the detection unit 402 detects contact of an operating body with the operating area 112A overlapping with the first sensing electrode 121. For example, when the capacitance value of the first sensing electrode 122 is higher than the predetermined threshold, the detection unit 402 detects contact of an operating body with the operating area 112B overlapping with the first sensing electrode 122. For example, when the capacitance value of the first sensing electrode 123 is higher than the predetermined threshold, the detection unit 402 detects contact of an operating body with the operating area 112C overlapping with the first sensing electrode 123. When the capacitance values of two or more sensing electrodes become higher than the predetermined threshold at the same time, the detection unit 402 determines that an operating body has come into contact with one operating area overlapping with a sensing electrode with the highest capacitance value.

The determination unit 403 determines, of the first sensing electrodes 121 to 123 and the second sensing electrodes 131 and 132, a plurality of sensing electrodes around one operating area where contact of an operating body is detected by the detection unit 402 as "a plurality of peripheral electrodes" for use in determining whether a contact operation has been performed.

For example, when contact of an operating body with the operating area 112A is detected by the detection unit 402, the determination unit 403 determines the first sensing electrode 122, the second sensing electrode 131, and the second sensing electrode 132 around the operating area 112A as "a plurality of peripheral electrodes".

For example, when contact of an operating body with the operating area 112B is detected by the detection unit 402, the determination unit 403 determines the first sensing electrode 121, the first sensing electrode 123, the second sensing electrode 131, and the second sensing electrode 132 around the operating area 112B as "a plurality of peripheral electrodes".

For example, when contact of an operating body with the operating area 112C is detected by the detection unit 402, the determination unit 403 determines the first sensing electrode 122, the second sensing electrode 131, and the second sensing electrode 132 around the operating area 112C as "a plurality of peripheral electrodes".

The weighting unit 404 may weight the respective capacitance values of the "plurality of peripheral electrodes" acquired by the acquisition unit 401 using the weightings stored in the storage 400.

The sum calculating unit 405 calculates the sum of the respective capacitance values of the "plurality of peripheral electrodes" weighted by the weighting unit 404.

The control unit 406 determines whether to validate the contact operation on the one operating area where contact of an operating body is detected by the detection unit 402 on the basis of the sum calculated by the sum calculating unit 405. For example, when the sum calculated by the sum calculating unit 405 is lower than a predetermined threshold, the control unit 406 may determine to validate the contact operation on the one operating area where contact of an operating body is detected by the detection unit 402. In contrast, when the sum calculated by the sum calculating unit 405 is higher than the predetermined threshold, the control unit 406 may determine to invalidate the contact operation on the one operating area where contact of an operating body is detected by the detection unit 402. In other words, when a contact operation on the one operating area where contact of an operating body is detected has a significant influence on "a plurality of peripheral electrodes", the contact operation on the one operating area is invalidated. Specifically, in a case where the operating-body contact position is an end of one operating area, so that the operation cannot be clearly regarded as being performed, or a case where the operating body itself is large, the contact is supposed to be unintended contact of a child's hand or part of an adult's body.

When the control unit 406 determines to validate the contact operation on the one operating area, the output unit 407 outputs a control signal corresponding to the operating area to the device to be operated. The output of the control signal by the output unit 407 may be performed via wireless communication or wire communication.

The functions of the control apparatus 150 shown in FIG. 4 are implemented, for example, by executing the programs stored in the ROM 152 of the control apparatus 150 with the CPU 151. These programs may be loaded in the control apparatus 150 in advance or may be externally loaded. In the latter case, these programs may be provided using an external storage medium (for example, a universal serial bus [USB] memory, a memory card, or a compact disk read only memory [CD-ROM]) or by being downloaded from a server on a network (for example, the Internet).

Example of Weightings Stored in Storage 400

FIG. 5 is a diagram showing examples of weightings stored in the storage 400 according to an embodiment. FIG. 5 shows, of the weightings stored in the storage 400, weightings for the three peripheral electrodes (the first sensing electrode 122, the second sensing electrode 131, and the second sensing electrode 132) to be applied when an operating body comes into contact with the operating area 112A. In the example shown in FIG. 5, the storage 400 stores "0.7" as a weighting for the first sensing electrode 122. In the example shown in FIG. 5, the storage 400 stores "1.0" as a weighting for the second sensing electrode 131. In the example shown in FIG. 5, the storage 400 stores "1.9" as a weighting for the second sensing electrode 132.

For weightings for the individual peripheral electrodes, appropriate values derived from simulation, an actual device test, or the like are set according to the distance from the operating area 112A (and the first sensing electrode 121). The distance here may be not only the distance between the electrodes but also the distance between the centers of gravity of the electrodes.

In the example shown in FIG. 5, the weighting for the first sensing electrode 122 whose distance from the operating area 112A (and the first sensing electrode 121) is relatively small is set as low as "0.7" because an operation on the operating area 112A has a relatively large influence on the capacitance value of the first sensing electrode 122.

In the example shown in FIG. 5, the weightings for the second sensing electrodes 131 and 132 whose distances from the operating area 112A (and the first sensing electrode 121) are relatively large are set to "1.0" and "1.9", respectively, which are higher than that for the first sensing electrode 122 because an operation on the operating area 112A has lower influence on the capacitance values of the second sensing electrodes 131 and 132 than that on the first sensing electrode 122.

The weightings may be set on the basis of, not the distance from the operating area 112A (and the first sensing electrode 121) but another parameter that can influence the capacitance values (for example, the area of the peripheral electrodes, the shape of the peripheral electrodes, the layout of the wiring pattern 160 connecting to the peripheral electrodes, or the direction of operation performed by the operator). In the case where the influence on the peripheral electrodes when the operating area 112A is operated is large, for example, when the area of the peripheral electrodes is significantly larger than the area of the operating area 112A, when the peripheral electrodes are arranged so as to enclose the operating area 112A, when the wiring pattern 160 connecting to the peripheral electrodes is disposed in the vicinity of the operating area 112A, or when the operation performed by the operator is performed from the front (the Y-axis positive side), lower weightings are set for the peripheral electrodes. Example reasons that the weighting for the second sensing electrode 132 is set to "1.9" higher than the weighting "1.0" for the second sensing electrode 131 include the direction of operation performed by the operator and the layout of the wiring pattern 160.

Processing Procedure of Control Apparatus 150

Figure 6:
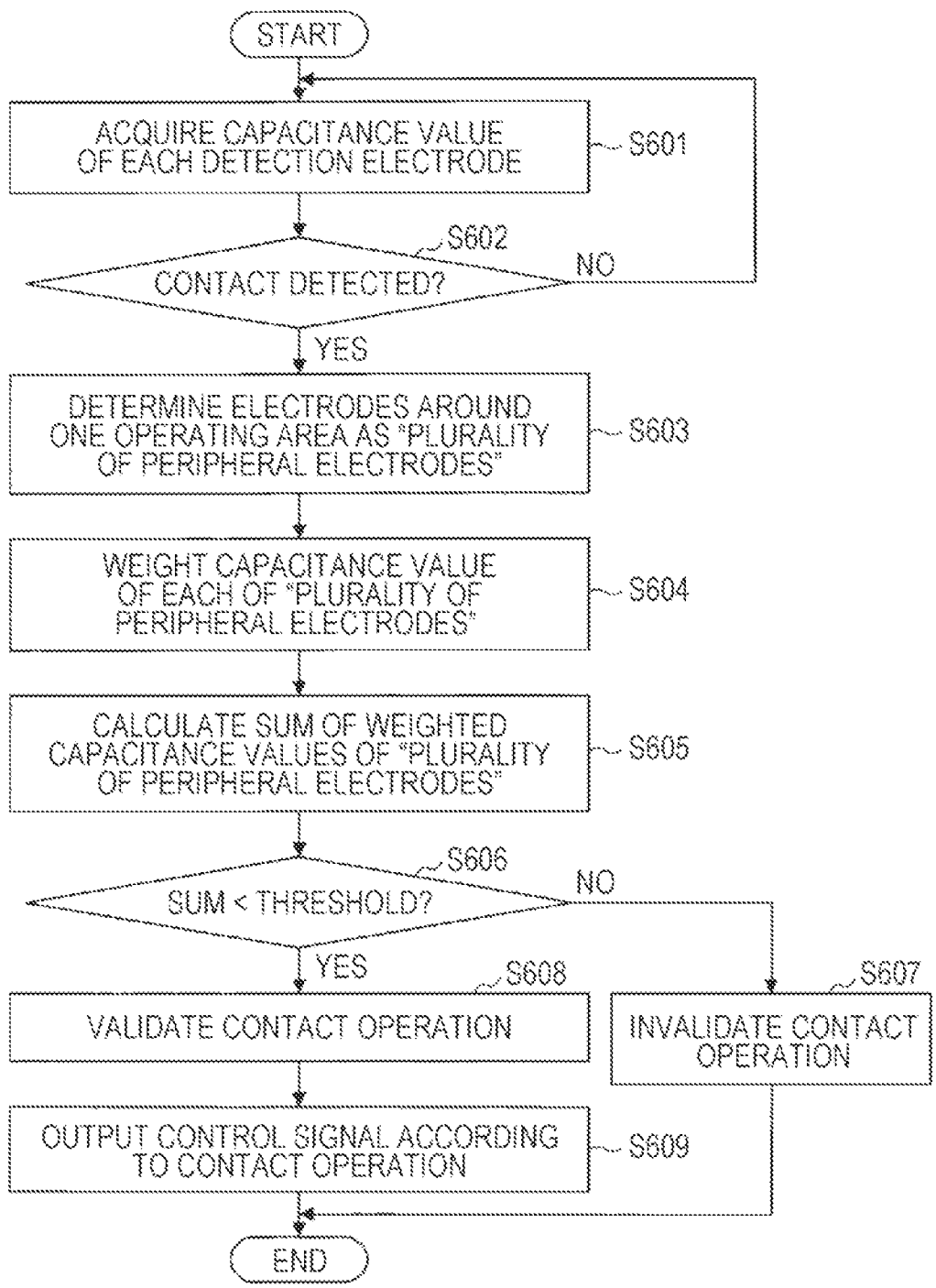
FIG. 6 is a flowchart showing a processing procedure of the control apparatus according to an embodiment.

FIG. 6 is a flowchart showing a processing procedure of the control apparatus 150 according to an embodiment.

First, the acquisition unit 401 acquires the respective capacitance values of the first sensing electrodes 121 to 123 and the second sensing electrodes 131 and 132 (step S601).

Next, the detection unit 402 determines whether an operating body has come into contact with one of the operating areas 112A to 112C on the basis of the respective capacitance values of the first sensing electrodes 121 to 123 acquired at step S601 (step S602).

If at step S602 it is determined that no operating body has come into contact with any of the operating areas 112A to 112C (step S602: No), the control apparatus 150 returns the process to step S601.

In contrast, if at step S602 it is determined that an operating body has come into contact with one of the operating areas 112A to 112C (step S602: Yes), then the determination unit 403 determines, of the first sensing electrodes 121 to 123 and the second sensing electrodes 131 and 132, a plurality of electrodes around one operating area where contact of the operating body is detected as "plurality of peripheral electrodes" (step S603).

The weighting unit 404 weights the respective capacitance values of the "plurality of peripheral electrodes" acquired at step S601 using weightings stored in the storage 400 (step S604). Here, the weighting unit 404 multiplies the individual capacitance values by the weightings as an example of weighting.

The sum calculating unit 405 calculates the sum of the capacitance values of the "plurality of peripheral electrodes" weighted by the weighting unit 404 (step S605).

Subsequently, the control unit 406 determines whether the sum calculated at step S605 is higher than a predetermined threshold (step S606).

If at step S606 it is determined that the sum calculated at step S605 is higher than the predetermined threshold (step S606: No), then the control unit 406 determines to invalidate the contact operation on the one operating area where contact of the operating body is detected at step S602 (step S607). Thereafter, the control apparatus 150 terminates the series of processes shown in FIG. 6.

In contrast, if at step S606 it is determined that the sum calculated at step S605 is lower than the predetermined threshold (step S606: Yes), then the control unit 406 determines to validate the contact operation on the one operating area where contact of the operating body is detected at step S602 (step S608).

Then, the output unit 407 outputs a control signal according to the one operating area where contact of the operating body is detected at step S602 to the device to be processed (step S609). Thereafter, the control apparatus 150 terminates the series of processes shown in FIG. 6.

EXAMPLES

Referring to FIG. 7 to FIGS. 10A to 10D, examples of the input apparatus 100 according to an embodiment will be described.

Configuration of Operating Area 112

Figure 7:
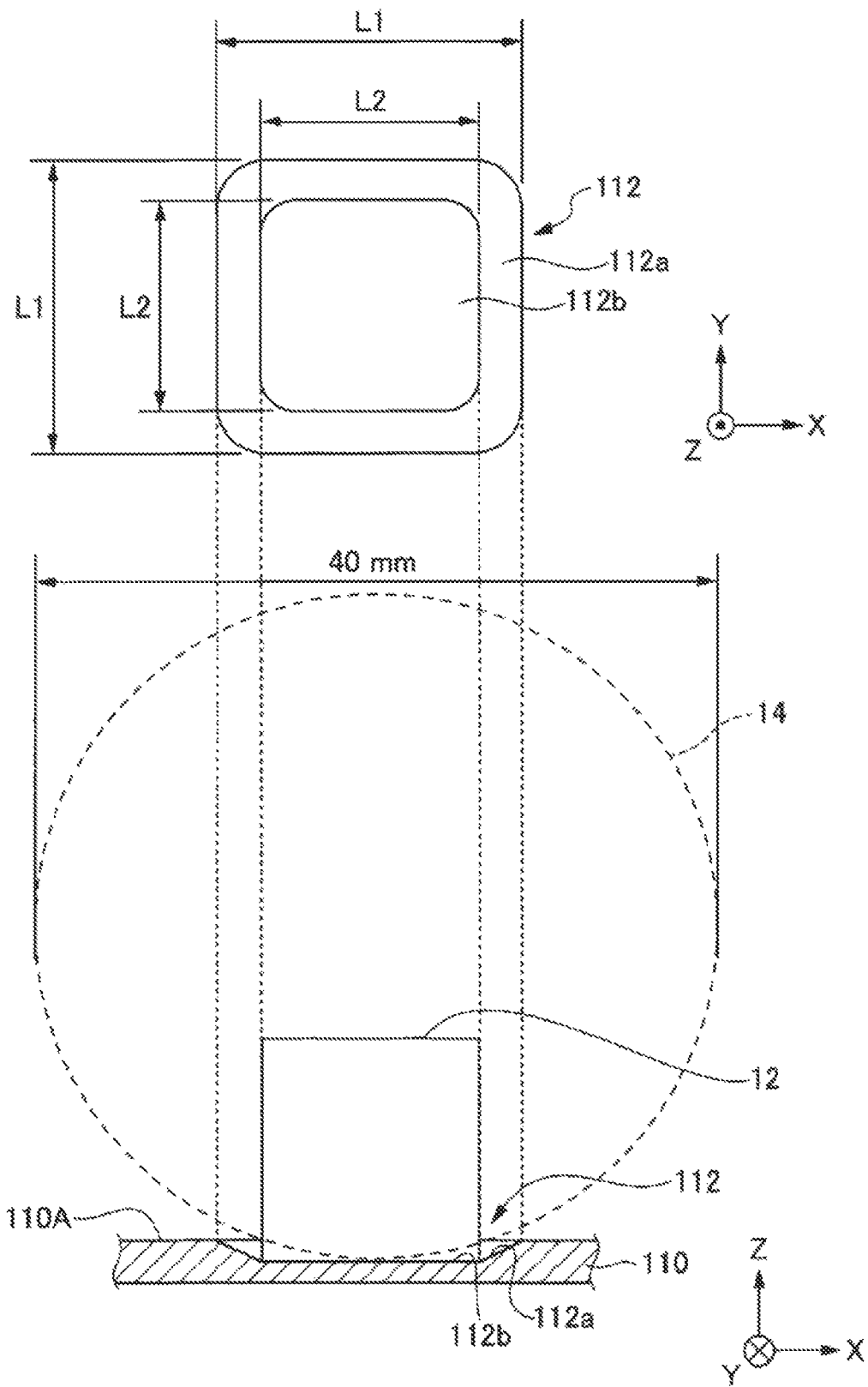
FIG. 7 is a diagram illustrating the configuration of an operating area in the input apparatus of an example.

FIG. 7 is a diagram illustrating the configuration of an operating area 112 in the input apparatus 100 of an example. As shown in FIG. 7, the operating area 112 (the operating areas 112A, 112B, and 112C) has a square shape one side of which has a first length L1. The operating area 112 has a recessed surface 112a that is generally recessed from the operating surface 110A, and at part of the recessed surface 112a, a square inner bottom surface 112b one side of which is a second length L2 shorter than the first length L1. The recessed surface 112a and the inner bottom surface 112b serve as a guide that guides an operator's finger so that it comes into contact with the vicinity of the center of the operating area 112 when the operator's finger comes into contact with the operating area 112 having the recessed surface 112a and the inner bottom surface 112b. As shown in FIG. 7, this example uses an electrically conductive column 12 and an electrically conductive sphere 14 that imitates a child's hand as examples of an operating body that performs a contact operation on the operating area 112. The column 12 is used as a mimic operator's finger and has a diameter of 13 mm in cross section along the end face of the column. The sphere 14 is used as a mimic child's hand and has a diameter of 40 mm. United States Regulation FMVSS118 requires that the roof and the blind are not closed when a switch operation is performed using a sphere with a diameter of 40 mm.

Measuring Point in Operating Area 112

Figure 8:
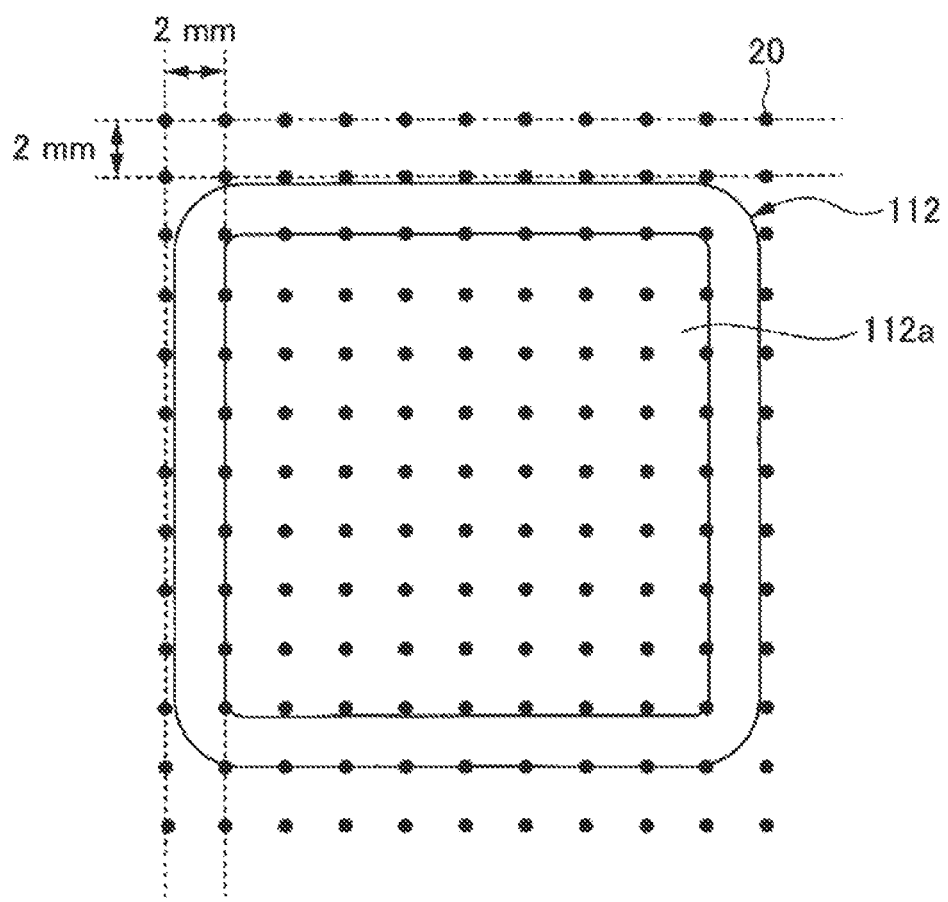
FIG. 8 is a diagram illustrating measuring points in the operating area of the input apparatus according to an example.

FIG. 8 is a diagram illustrating measuring points in the operating area 112 of the input apparatus 100 according to an example. As shown in FIG. 8, in this example, a plurality of measuring points 20 is arranged in a matrix of 11 columns and 13 rows in the operating area 112. In this example, the interval between two adjacent measuring points 20 is set at 2 mm in both of the column direction (Y-axis direction) and the row direction (X-axis direction).

Procedure for Implementation

In this example, it was verified what determination the input apparatus 100 makes when an operating body is brought into contact with the individual measuring points 20 of the operating area 112A according to the following steps (1) to (5). In Example 1, a column 12 with a diameter of 13 mm (an example of "a second predetermined size" was used as the operating body. In Example 2, a sphere 14 with a diameter of 40 mm (an example of "a first predetermined size") was used as the operating body. An object of this verification is to verify that, when an operator's finger has come into contact with a central portion of the operating area 112A, changes in capacitance values generated in the plurality of peripheral electrodes have become lower than or equal to a predetermined threshold to validate the contact operation on the operating area 112A. Another object is to verify that, when an operator's finger has come into contact with a portion of the operating area 112A other than the central portion or when an object larger than an operator's finger has come into contact with the operating area 112A, changes in capacitance values generated in the plurality of peripheral electrodes have become higher than or equal to the predetermined threshold to invalidate the contact operation on the operating area 112A.

(1) An operating body was brought into contact with one of the plurality of measuring points 20 (see FIG. 8) in the operating area 112A.

(2) The respective capacitance values of the three peripheral electrodes (the first sensing electrode 122, the second sensing electrode 131, and the second sensing electrode 132) around the operating area 112A were measured with an operating body in contact with one measuring point 20 in the operating area 112A.

(3) The respective capacitance values of the plurality of peripheral electrodes (the first sensing electrode 122, the second sensing electrode 131, and the second sensing electrode 132) measured at step 2 were weighted using the weightings (see FIG. 5) stored in the storage 400. In other words, the capacitance value of the first sensing electrode 122 was weighted using a weighting of "0.7". The capacitance value of the second sensing electrode 131 was weighted using a weighting of "1.0". The capacitance value of the second sensing electrode 132 was weighted using a weighting of "1.9".

(4) The sum of the capacitance values of the three peripheral electrodes weighted at step 3 was calculated.

(5) The above steps 1 to 4 were executed for all of the measuring points 20 set in the operating area 112A.

Result of Verification: Example 1

FIGS. 9A to 9D are diagrams illustrating the result of measurement of the capacitance values and the result of calculation of the sum performed by the input apparatus 100 according to an example (Example 1). FIGS. 9A to (d) 9D show the capacitance values measured and calculated by the input apparatus 100 in Example 1 in which the column 12 with a diameter of 13 mm was used.

Figures 9A, 9B, 9C, 9D:
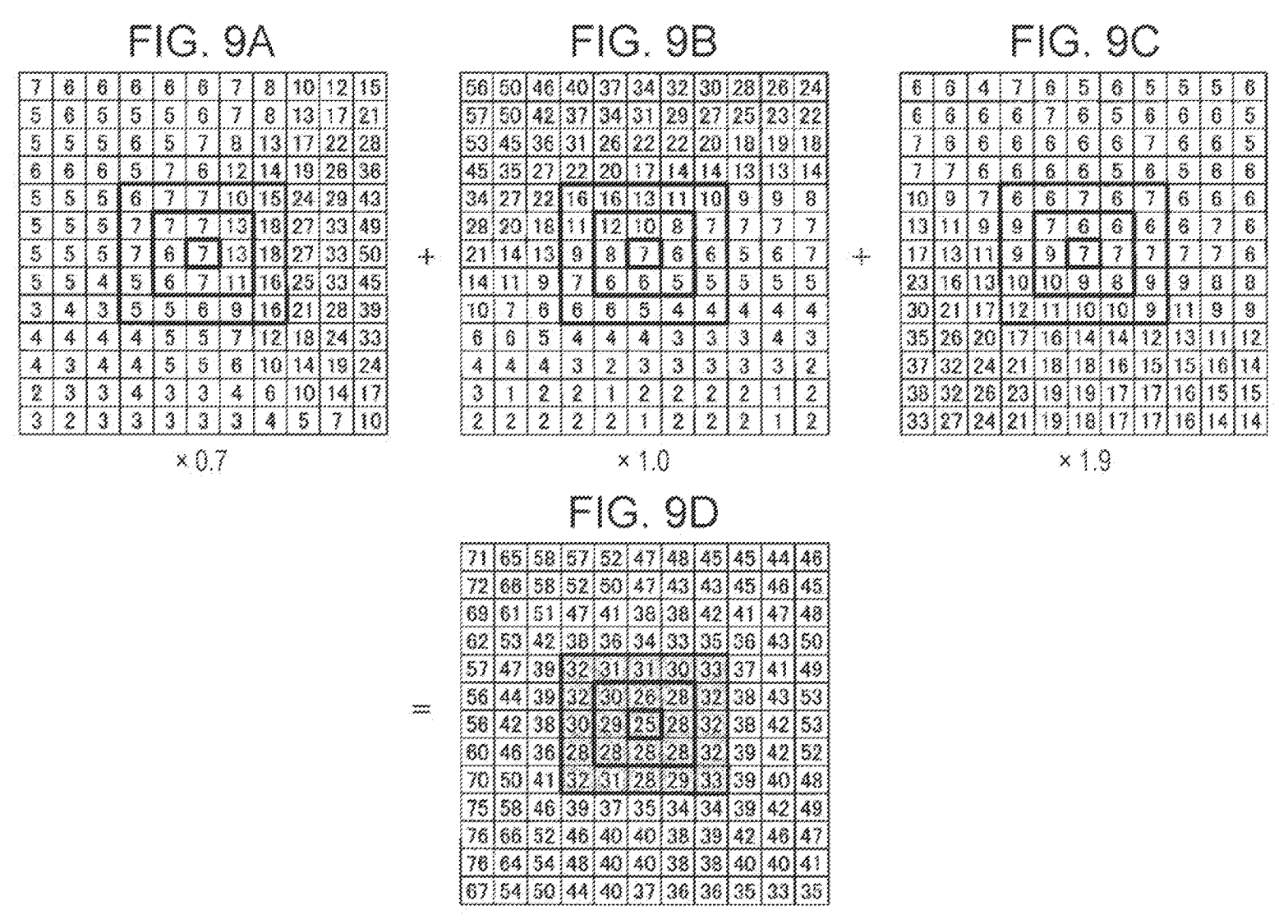

FIG. 9A shows the capacitance value of the first sensing electrode 122 measured at step 2 for each measuring point 20. FIG. 9B shows the capacitance value of the second sensing electrode 131 measured at step 2 for each measuring point 20. FIG. 9C shows the capacitance value of the second sensing electrode 132 measured at step 2 for each measuring point 20. FIG. 9D shows the sum of the capacitance values of the three peripheral electrodes (the first sensing electrode 122, the second sensing electrode 131, and the second sensing electrode 132) measured at step 4 for each measuring point 20.

As shown in FIG. 9D, Example 1 shows that, when the column 12 with a diameter of 13 mm was used, the sum of the capacitance values of the three peripheral electrodes was lower than or equal to a predetermined threshold "33" at all the measuring points 20 in a central portion (the area in the frame in the drawing, the area extending by 4 mm from the center to the front, back, left, and right) of the operating area 112A. This is because contact of a relatively small operating body with the central portion of the operating area 112A has relatively small influence on the peripheral electrodes. In other word, Example 1 shows that a correct contact operation in which an operator's finger is brought into contact with a central portion of the operating area 112A is performed, the input apparatus 100 of this embodiment can validate the contact operation.

In contrast, as shown in FIG. 9D, Example 1 shows that, when the column 12 with a diameter of 13 mm was used, the sum of the capacitance values of the three peripheral electrodes was higher than the predetermined threshold "33" at all the measuring points 20 around the operating area 112A (the area outside the frame in the drawing). This is because contact of a relatively small operating body with the periphery of the operating area 112A has relatively large influence on the peripheral electrodes. In other word, Example 1 shows that an erroneous operation in which an operator's finger is brought into contact with the periphery of the operating area 112A is performed, the input apparatus 100 of this embodiment can invalidate the contact operation.

Result of Verification: Second Example

FIGS. 10A to 10D are diagrams illustrating the result of measurement of the capacitance values and the result of calculation of the sum performed by the input apparatus 100 according to an example (Example 2). FIGS. 10A to 10D show the capacitance values measured and calculated by the input apparatus 100 in Example 2 in which the sphere 14 with a diameter of 40 mm was used.

Figures 10A, 10B, 10C, 10D:
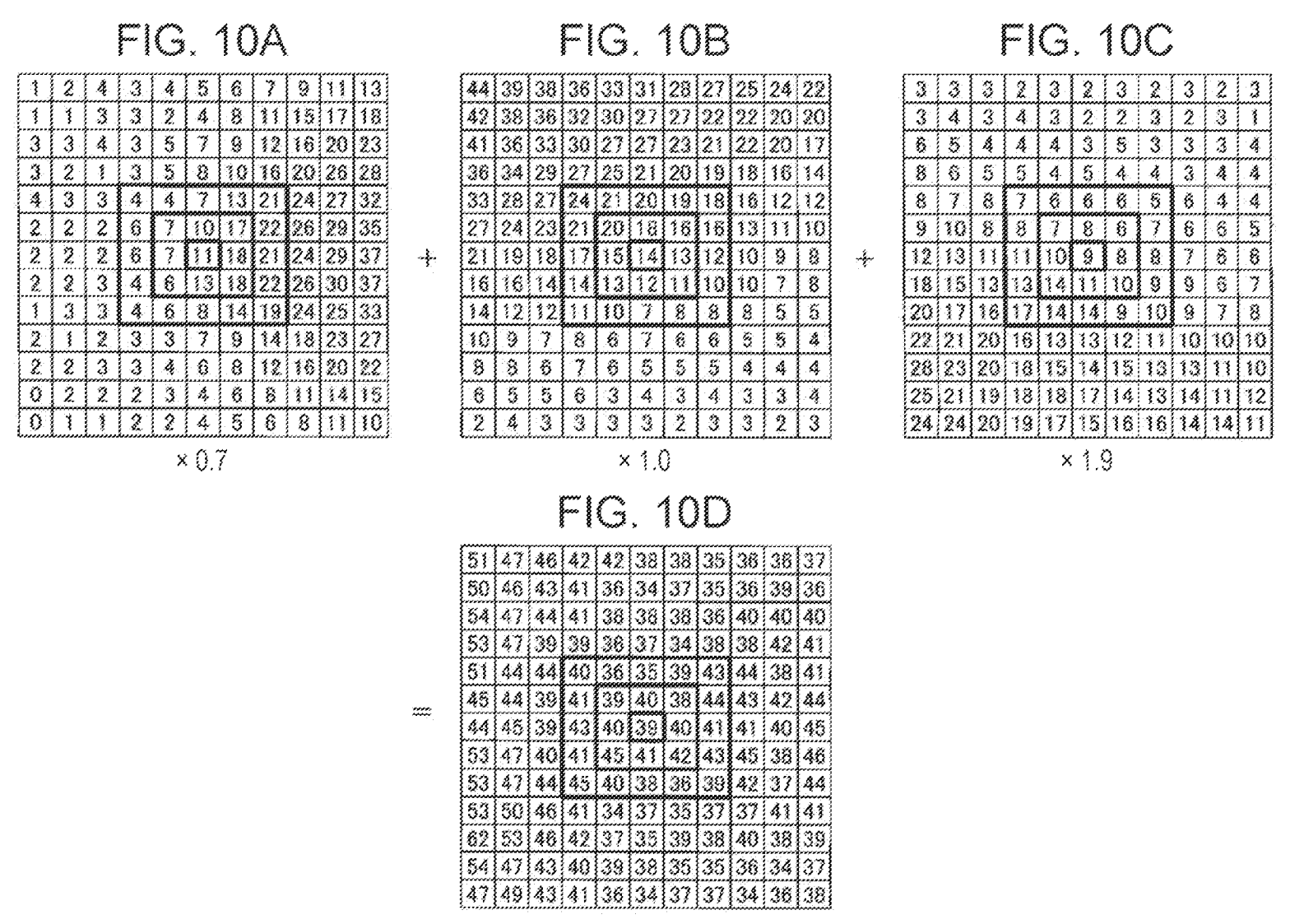

FIG. 10A shows the capacitance value of the first sensing electrode 122 measured at step 2 for each measuring point 20. FIG. 10B shows the capacitance value of the second sensing electrode 131 measured at step 2 for each measuring point 20. FIG. 10C shows the capacitance value of the second sensing electrode 132 measured at step 2 for each measuring point 20. FIG. 10D shows the sum of the capacitance values of the three peripheral electrodes (the first sensing electrode 122, the second sensing electrode 131, and the second sensing electrode 132) measured at step 4 for each measuring point 20.

As shown in FIG. 10D, Example 2 shows that, when the sphere 14 with a diameter of 40 mm was used, the sum of the capacitance values of the three peripheral electrodes was higher than the predetermined threshold "33" at almost all the measuring points 20. This is because contact of a relatively large operating body with the operating area 112A has relatively large influence on the peripheral electrodes. In other word, Example 2 shows that even an erroneous contact operation in which a child's has come into contact with the operating area 112A is performed, the input apparatus 100 of this embodiment can invalidate the contact operation as an erroneous operation.

Comparative Example 1

FIG. 11 is a diagram illustrating the result of calculation of the sum of the capacitance values according to Comparative Example 1. FIG. 11 shows a comparative example (Comparative Example 1) compared with Example 1 shown in FIG. 9D, in which the sum of the capacitance values of the three peripheral electrodes (the first sensing electrode 122, the second sensing electrode 131, and the second sensing electrode 132) using a column 12 with a diameter of 13 mm, without being weighted, for each measuring point 20.

As shown in FIG. 11, in Comparative Example 1, the sum of the capacitance values of the three peripheral electrodes when the column 12 with a diameter of 13 mm has come into contact was lower than the predetermined threshold "33" at the central portion of the operating area 112A as is intended. However, in Comparative Example 1, the sum of the capacitance values of the three peripheral electrodes when the column 12 with a diameter of 13 mm has come into contact was lower than the predetermined threshold "33" at part of the periphery of the operating area 112A contrary to the target.

For this reason, the input apparatus 100 of this embodiment weights the capacitance value of each peripheral electrode using an appropriate weighting, as shown in FIG. 9D. The allows the input apparatus 100 of this embodiment to make the sum of the capacitance values of the three peripheral electrodes when the column 12 with a diameter of 13 mm comes into contact with the central portion of the operating area 112A lower than the predetermined threshold "33" and to make the sum of the capacitance values of the three peripheral electrodes when the column 12 with a diameter of 13 mm comes into contact with the periphery of the operating area 112A higher than the predetermined threshold "33", as shown in FIG. 9D.

Comparative Example 2

FIG. 12 is a diagram illustrating the result of calculation of the sum of the capacitance values according to Comparative Example 2. FIG. 12 shows a comparative example (Comparative Example 2) compared with Example 2 shown in FIG. 10D, in which the sum of the capacitance values of the three peripheral electrodes (the first sensing electrode 122, the second sensing electrode 131, and the second sensing electrode 132) using a sphere 14 with a diameter of 40 mm, without being weighted, for each measuring point 20.

As shown in FIG. 12, in Comparative Example 2, the sum when the sphere 14 with a diameter of 40 mm has come into contact with the operating area 112A was partly lower than the predetermined threshold "33" contrary to the target.

For this reason, the input apparatus 100 of this embodiment weights the capacitance value of each peripheral electrode using an appropriate weighting, as shown in FIG. 10D. This allows the input apparatus 100 of this embodiment to make the sum of the capacitance values of the three peripheral electrodes higher than the predetermined threshold "33" even when the sphere 14 with a diameter of 40 mm comes into contact with any portion of the operating area 112A, as shown in FIG. 10D.

As described above, the input apparatus 100 according to this embodiment includes the operating areas 112A, 112B, and 112C arranged close to one another on the operating surface 110A, the first sensing electrodes 121, 122, and 123 disposed in one-to-one correspondence with the operating areas 112A, 112B, and 112C, the second sensing electrodes 131 and 132 disposed around the first sensing electrodes 121, 122, and 123, and the control unit 406. When contact of an operating body with one of the operating areas 112A, 112B, and 112C is detected by a first sensing electrode corresponding to the one operating area, the control unit 406 makes control different according to the contact operation on the one operating area according to the sum of the capacitance values of a plurality of peripheral electrodes around the one operating area.

This allows the input apparatus 100 according to this embodiment to determine the size of the operating body, which affects the plurality of peripheral electrodes, from the sum of the capacitance values of the plurality of peripheral electrodes and to make control different according to the size. Accordingly, the input apparatus 100 according to this embodiment allows making control when a contact operation is performed with an operating body having a size larger than the size of a supposed operating body different from control when a contact operation is performed with the supposed operating body.

In the input apparatus 100 according to this embodiment, when the sum is lower than a predetermined threshold, the control unit 406 validates a contact operation on one operating area, and when the sum is higher than the predetermined threshold, invalidates the contact operation on the one operating area.

Thus, the input apparatus 100 according to this embodiment can make the sum higher than the predetermined threshold when a contact operation with an operating body with a size larger than the size of a supposed operating body is performed, which allows the contact operation to be invalidated.

The input apparatus 100 according to this embodiment further includes the weighting unit 404 that weights the capacitance value of each of the plurality of peripheral electrodes using a predetermined weighting, and the control unit 406 determines whether to validate a contact operation on one operating area on the basis of the sum of the weighted capacitance values of the plurality of peripheral electrodes.

Thus, the input apparatus 100 according to this embodiment can determine whether the operating body has a size larger than the size of a supposed operating body by using an appropriate weighting for each of the plurality of peripheral electrodes according to the degree of influence of each of the plurality of peripheral electrodes on the sum.

In the input apparatus 100 according to this embodiment, the weighting of each of the plurality of peripheral electrodes is set according to the distance of each of the plurality of peripheral electrodes from one operating area.

This allows the input apparatus 100 according to this embodiment to determine whether the operating body has a size larger than the size of a supposed operating body with higher accuracy by using an appropriate weighting for each of the plurality of peripheral electrodes according to the distance of each of the plurality of peripheral electrodes from one operating area.

In the input apparatus 100 according to this embodiment, the weighting of each of the plurality of peripheral electrodes is also set according to at least one of the area or the shape of each of the plurality of peripheral electrodes, a wiring pattern connecting to the peripheral electrodes, and the direction of operation performed by the operator.

Thus, the input apparatus 100 according to this embodiment can determine whether the operating body has a size larger than the size of a supposed operating body with higher accuracy by using an appropriate weighting for each of the plurality of peripheral electrodes, also according to one of the area or the shape of each of the plurality of peripheral electrodes, a wiring pattern connecting to the peripheral electrodes, and the direction of operation performed by the operating body.

In the input apparatus 100 according to this embodiment, in the case where the operating body has a predetermined first size, even when the operating body comes into contact with any portion of one operating area, the sum is higher than a predetermined threshold, and in the case where the operating body has a second predetermined size smaller than the first predetermined size, when the operating body comes into contact with a central portion of one operating area, the sum is lower than the predetermined threshold first, and when the operating body comes into contact with the periphery of one operating area, the sum is higher than the predetermined threshold.

This allows the input apparatus 100 according to this embodiment to invalidate the contact operation on one operating area with an operating body having a first predetermined size and a contact operation on the periphery of one operating area with an operating body having a second predetermined size as an erroneous operation.

The input apparatus 100 according to this embodiment is capable of invalidating an operation with a child's hand as an erroneous operation. The input apparatus 100 according to this embodiment can invalidate a contact operation on the periphery of one operating area with an operator's finger as an erroneous operation.

In the input apparatus 100 according to this embodiment, when contact of an operating body with two or more of the operating areas 112A, 112B, and 112C is detected, the control unit 406 determines whether to validate a contact operation on, of the operating areas 112A, 112B, and 112C, one operating area where the capacitance value of a corresponding first sensing electrode is the highest.

This allows the input apparatus 100 according to this embodiment, even when contact of an operating body with two or more of the operating areas 112A, 112B, and 112C is detected, to determine with high accuracy, of the operating areas 112A, 112B, and 112C, an operating area where the contact operation was performed.

In the input apparatus 100 according to this embodiment, the second sensing electrodes 131 and 132 are used only as peripheral electrodes.

Thus, the input apparatus 100 according to this embodiment can increase in the number of electrodes around one operating area by including the second sensing electrodes 131 and 132 used only as peripheral electrodes. This allows the size of an operating body that has an influence on the plurality of peripheral electrodes to be determined with high accuracy.

Having described an embodiment of the present invention in detail, the present invention is not limited to the embodiment and can be variously modified or changed within the scope of the present invention described in the claims.

For example, the input apparatus 100 of this embodiment does not have to include the operating area 112B and may use the first sensing electrode 122 only as a "peripheral electrode".

The input apparatus 100 of the above embodiment invalidates a contact operation performed by a sphere with a diameter of 40 mm. This is merely illustrative. For example, when a contact operation using a sphere with a diameter of 40 mm is performed, another control other than invalidation (for example, notification that the contact operation is invalid) may be performed.

What is claimed is:

1. An input apparatus comprising:
   at least one operating area on an operating surface;
   at least one first sensing electrode corresponding to the operating area;
   a plurality of electrodes around the first sensing electrode; and
   a control unit configured to, when contact of an operating body with the operating area is detected by the first sensing electrode, make control different according to a contact operation on the one operating area according to a sum of capacitance values of electrodes of the plurality of peripheral electrodes around the operating area where the contact of the operating body is detected,
   wherein, when the sum is lower than a predetermined threshold, the control unit validates the contact operation on the operating area, and
   wherein, when the sum is higher than the predetermined threshold, the control unit invalidates the contact operation on the operating area.

2. The input apparatus according to claim 1, further comprising:
   a weighting unit configured to weight the capacitance value of each of the plurality of peripheral electrodes using a predetermined weighting,
   wherein the control unit determines whether to validate the contact operation on the operating area based on a sum of the weighted capacitance values of the plurality of peripheral electrodes.

3. The input apparatus according to claim 2, wherein the weighting of each of the plurality of peripheral electrodes is set according to a distance of each of the plurality of peripheral electrodes from the operating area.

4. The input apparatus according to claim 3, wherein the weighting of each of the plurality of peripheral electrodes is set according to at least one of an area and a shape of each of the peripheral electrodes, a layout of a wiring pattern connecting to the peripheral electrodes, and a direction of an operation performed by an operator.

5. The input apparatus according to claim 1,
   wherein, in a case where the operating body has a first predetermined size, even when the operating body comes into contact with any position of the operating area, the sum is higher than the predetermined threshold, and
   wherein, in a case where the operating body has a second predetermined size smaller than the first predetermined size, when the operating body comes into contact with a center of the operating area, the sum is lower than the predetermined threshold, and when the operating body comes into contact with a periphery of the operating area, the sum is higher than the predetermined threshold.

6. The input apparatus according to claim 1,
   wherein the at least one operating area comprises a plurality of operating areas,
   wherein the at least one first sensing electrode comprises a plurality of first sensing electrodes corresponding to the plurality of operating areas,
   wherein the input apparatus comprises the plurality of electrodes around each of the plurality of first sensing electrodes, and
   wherein, when contact of the operating body with a plurality of areas of the plurality of operating areas is detected, the control unit determines whether to validate a contact operation on one of the plurality of operating areas where a capacitance value of the corresponding first sensing electrode is highest.

7. The input apparatus according to claim 6, wherein the plurality of electrodes includes only others of the first sensing electrodes corresponding to any of the plurality of operating areas.

8. The input apparatus according to claim 6, wherein the plurality of electrodes includes only second sensing electrode s that do not correspond to any of the plurality of operating areas.

9. The input apparatus according to claim 6,
wherein the plurality of electrodes includes:
 another of the first sensing electrodes corresponding to any of the plurality of operating areas; and
 a second sensing electrode not corresponding to any of the plurality of operating areas.

\* \* \* \* \*